US 6,621,754 B1

(12) United States Patent
Chang

(10) Patent No.: US 6,621,754 B1
(45) Date of Patent: Sep. 16, 2003

(54) MEMORY INTERFACE CONTROL CIRCUIT

(75) Inventor: Chen-Yu Chang, Junghe (TW)

(73) Assignee: Micro-Star Int'l Co., Ltd., Taipei Hsien (TW)

( * ) Notice: Subject to any disclaimer, the term of this patent is extended or adjusted under 35 U.S.C. 154(b) by 0 days.

(21) Appl. No.: 10/192,622

(22) Filed: Jul. 10, 2002

(51) Int. Cl.[7] ............................................... G11C 7/00
(52) U.S. Cl. ........................................... 365/226; 51/63
(58) Field of Search ............................. 365/226, 51, 63, 365/52

(56) References Cited

U.S. PATENT DOCUMENTS

2002/0003740 A1 * 1/2002 Chang et al. ................ 365/226
2002/0012263 A1 * 1/2002 Ohshima et al. .............. 365/51

* cited by examiner

Primary Examiner—Huan Hoang
(74) Attorney, Agent, or Firm—Winston Hsu

(57) ABSTRACT

A memory interface control circuit. The SDRAM slot is for a SDRAM and is coupled to a memory control chip. The SDRAM slot comprises a floating pin responding to a ground pad of the SDRAM. The DDR-RAM slot is for a DDR-RAM and is coupled to the memory control chip. The voltage switching circuit includes an input terminal coupled to the floating pin and provides power to the SDRAM or the DDR-RAM according to the voltage level of the floating pin. The terminal circuit includes a plurality of transistors, a first terminal coupled to a reference voltage, a second terminal coupled to a terminal resistor and a control terminal coupled to the floating pin. The voltage switching circuit selectively provides power, and the terminal is switched according to the voltage level of the floating pin.

4 Claims, 2 Drawing Sheets

MEMORY INTERFACE CONTROL CIRCUIT

BACKGROUND OF THE INVENTION

1. Field of the Invention

The present invention relates in general to a memory interface control circuit. In particular, the present invention relates to a memory interface control circuit to combine and support a plurality of memories of different types in a memory control chip.

2. Description of the Related Art

Recently, the operating rates of central processing units (CPU) and bandwidth of computer systems are increasing, so the bandwidth of peripherals have to be increased to improve operating efficiency. The peripherals include memory, display card, and hard disks. While early memory uses dynamic random access memory (DRAM), synchronous dynamic random access memory (SDRAM) is being substituted for DRAM because the rate of DRAM is slow. Although standards of SDRAM have improved from PC-66, PC-100, and PC-133 through PC-150, speed of SDRAM still presents a bottleneck.

The newest memory is double date rate DRAM (DDR-DRAM). DDR-DRAM accesses double data during a clock operation, and the total accessed data rate is doubled to improve operating efficiency. However, DDR-DRAM is too expensive to substitute for SDRAM at this time. Thus, the computer system usually comprises SDRAM and DDR-DRAM slots simultaneously, and comprises a memory control chip to control both SDRAM and DDR-DRAM. Moreover, the cost is decreased when the SDRAM and DDR-DRAM are merged in the memory control chip.

However, since pin counts, power, and interface of SDRAM and DDR-DRAM are different, it is hard to merge SDRAM and DDR-DRAM with a memory control chip and on a main board. FIG. 2 shows the connection of the conventional SDRAM. FIG. 3 shows the connection of the conventional DDR-DRAM. The SDRAM and DDR-DRAM are all connected to the memory control chip 50. The pin number of the dual inline memory module (DIMM) 30 of SDRAM is 168, and the pin number of the dual inline memory module (DIMM) 40 of DDR-DRAM is 184. The voltage supplied to the SDRAM DIMM 30 is 3.3V, high-level signal is 2.0V, and low-level signal is 0.8V. In addition, the voltage supplied to the DDR-DRAM DIMM 40 is 2.5V, high-level signal is VTT+0.35V, and low-level signal is VTT−0.35V. Here, VTT is 1.25V. The resistors 41 are coupled between VTT and DDR-DRAM DIMM 40. Since there are many standard differences between SDRAM DIMM 30 and DDR-DRAM DIMM 40, it is very difficult to merge SDRAM DIMM 30 and DDR-DRAM DIMM 40 in a main board.

SUMMARY OF THE INVENTION

The object of the present invention is to provide a memory interface circuit to control memories of different types by adding peripheral circuitry.

Another object of the present invention is to provide a memory interface control circuit that includes a power switching circuit and a terminal switch. When the SDRAM is inserted into the SDRAM DIMM, the voltage level of a predetermined pin of SDRAM DIMM will be changed. Then, the power switching circuit and the terminal switch respond by switching to adjust the voltage supplied to the memory and the peripheral circuits. Thus, the memory control chip can drive memories of different types.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1:
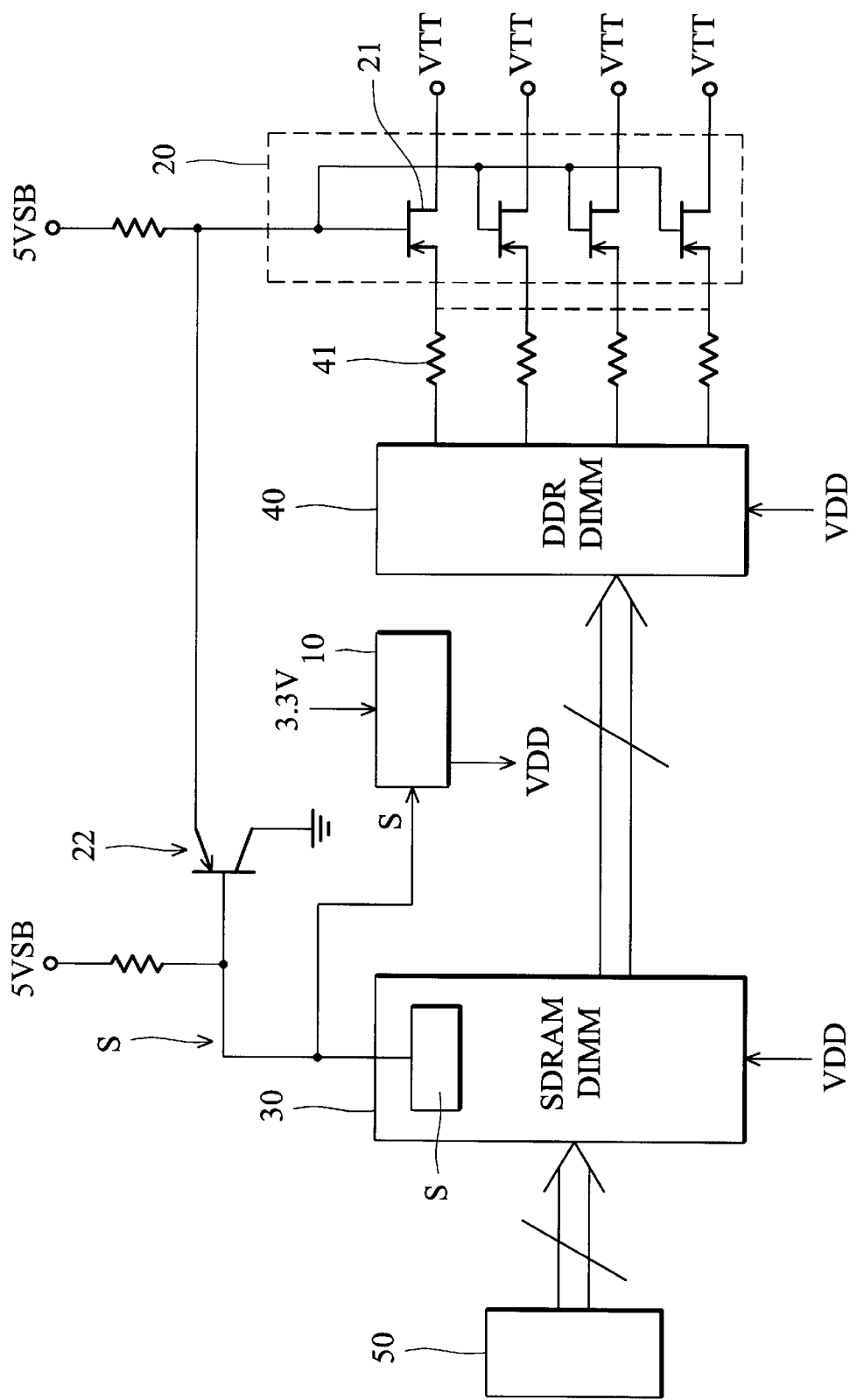
FIG. 1 is a circuit diagram according to the embodiment of the present invention.
Figure 3:
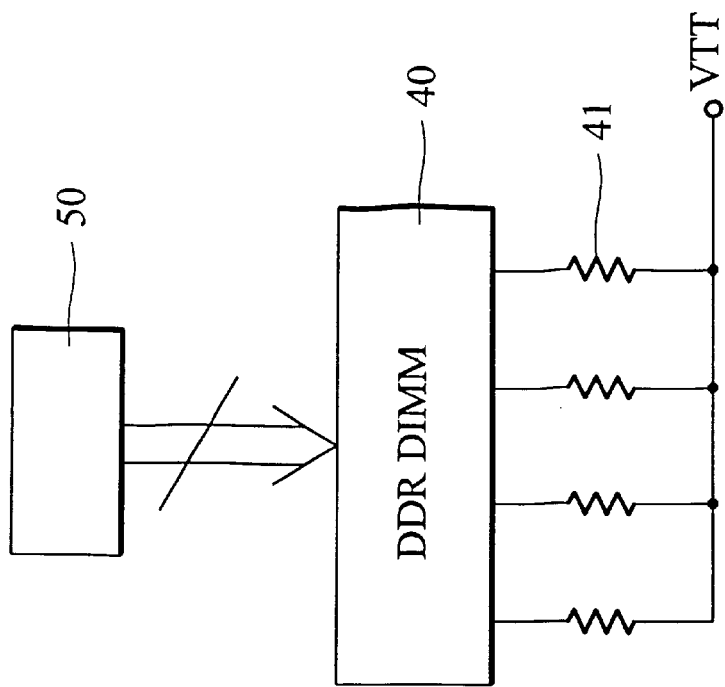
FIG. 3 shows the connection of the conventional DDR-DRAM.
Figure 2:
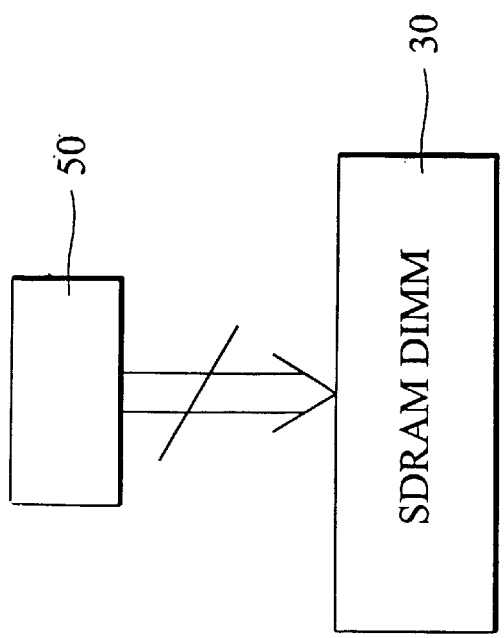
FIG. 2 shows the connection of the conventional SDRAM.

FIG. 1 is a circuit diagram according to the embodiment of the present invention. According to the present invention, the memory control chip 50 is connected to and supports memories with different standards, such as SDRAM and DDR-DRAM.

The memory interface control circuit according to the embodiment of the present invention comprises a power switching circuit 10, a detection transistor 22 and a terminal circuit 20. The power switching circuit 10 selected provides 2.5V and 3.3V voltages. The terminal circuit 20 is composed of a plurality of transistors. The SDRAM DIMM 30 and DDR-DRAM DIMM 40 are the slots for the SDRAM and DDR-DRAM respectively, both connected to the memory control chip 50. There is a floating pin S in the SDRAM DIMM 30, responding to the ground pad of the SDRAM.

When the SDRAM is not inserted into the SDRAM DIMM 30, the floating pin S is at a high voltage level because of its connection to the positive power through resistors. When the SDRAM is inserted into the SDRAM DIMM 30, the floating pin S is at a low voltage level because of its connection to the ground pad of the SDRAM. Thus, the voltage level of the floating pin S is detected to determined whether the SDRAM is inserted into the SDRAM DIMM 30, and the operation voltage and the connection of peripherals are adjusted correspondingly. As shown in FIG. 1, the floating pin S is coupled to the input of the power switching circuit 10 and coupled to the controlling terminal of the terminal circuit 20 through detection transistor 22.

When the SDRAM is not inserted into the SDRAM DIMM 30, the voltage level of the floating pin S is high. The high voltage level signal is provided to the input of the power switching circuit 10 and makes the power switching circuit 10 output VDD of 2.5V, provided to the DDR DIMM 40 and SDRAM DIMM 30. However, there is no SDRAM in the SDRAM DIMM 30. Moreover, detection transistor 22 is a PNP bipolar or a PMOS transistor, so the detection transistor 22 is turned off by the high voltage level signal provided by the floating pin S. Thus, the transistors, field-effect transistors or electrical switches, of the terminal circuit 20 are turned on by 5VSB to provide VTT to the DRR DIMM 40 through terminal circuit 20 and each terminal resistor 41.

On the contrary, when the SDRAM is inserted into the SDRAM DIMM 30, the voltage level of the floating pin S is low because of its connection to ground through SDRAM. The low voltage level signal is provided to the input of the power switching circuit 10 and makes the power switching circuit 10 output VDD of 3.3V, provided to the SDRAM DIMM 30. Moreover, detection transistor 22 is a PNP bipolar or a PMOS transistor, so the detection transistor 22 is turned on by the low voltage level signal provided by the floating pin S. Thus, the transistors of the terminal circuit 20 are turned off and the terminal resistors 41 are disabled. Thus, only the DDR-RAM is operated.

According to the embodiment of the present invention, cheaper SDRAM can be used at any time. After the price of DDR-RAM decreases, DDR-RAM can substitute for SDRAM without changing the circuitry of the main board.

Moreover, the memory interface control circuit according to the embodiment of the present invention controls memories of different types by adding simple peripherals.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A memory interface control circuit, comprising:
   a SDRAM slot for a SDRAM and coupled to a memory control chip, wherein the SDRAM slot comprises a floating pin responding to a ground pad of the SDRAM;
   a DDR-RAM slot for a DDR-RAM and coupled to the memory control chip;
   a voltage switching circuit having an input terminal coupled to the floating pin to provide power to the SDRAM or the DDR-RAM according to the voltage level of the floating pin; and
   a terminal circuit comprising a plurality of transistors having a first terminal coupled to a reference voltage, a second terminal coupled to a terminal resistor and a control terminal coupled to the floating pin; wherein the voltage switching circuit selectively provides the power, and the terminal circuit is switched according to the voltage level of the floating pin.

2. The memory interface control circuit as claimed in claim 1, wherein the voltage switching circuit provides 2.5V or 3.3V according to the voltage of the input terminal.

3. The memory interface control circuit as claimed in claim 1, further comprising a detection transistor coupled between the floating pin and the terminal circuit.

4. The memory interface control circuit as claimed in claim 1, wherein the transistors of the terminal circuit are field-effect transistors or electrical switches.

* * * * *